(12) United States Patent
Liao et al.

(10) Patent No.: US 7,473,105 B2
(45) Date of Patent: Jan. 6, 2009

(54) ELECTRICAL CONNECTOR

(75) Inventors: Fang-Jun Liao, Tu-Cheng (TW);
Jia-Hau Liu, Tu-Cheng (TW);
Shuo-Hsiu Hsu, Tu-Cheng (TW)

(73) Assignee: Hon Hai Precision Ind. Co., Ltd.,
Taipei Hsien (TW)

( * ) Notice: Subject to any disclaimer, the term of this patent is extended or adjusted under 35 U.S.C. 154(b) by 0 days.

(21) Appl. No.: 11/810,647

(22) Filed: Jun. 6, 2007

(65) Prior Publication Data
US 2007/0281508 A1      Dec. 6, 2007

(30) Foreign Application Priority Data
Jun. 6, 2006      (TW)      ............ 200620073475.4

(51) Int. Cl.
*H01R 12/00*      (2006.01)
(52) U.S. Cl. ............................................ 439/71
(58) Field of Classification Search .............. 439/71, 439/526, 910, 70, 72–73, 525, 912
See application file for complete search history.

(56) References Cited

U.S. PATENT DOCUMENTS

| | | | | |
|---|---|---|---|---|
| 5,437,557 A | * | 8/1995 | Sagano | ............ 439/72 |
| 6,699,047 B1 | * | 3/2004 | McHugh et al. | .......... 439/71 |
| 7,056,130 B1 | | 6/2006 | McAlonis et al. | |
| 2005/0032408 A1 | * | 2/2005 | Liao et al. | .......... 439/331 |

* cited by examiner

*Primary Examiner*—Edwin A. Leon
(74) *Attorney, Agent, or Firm*—Wei Te Chung

(57) ABSTRACT

An electrical connector (1) includes a connector body (51) holding a plurality of contacts (52). The connector body includes a base section (511) with four side walls (512) surrounded thereby to form an interior cavity adapted to receive an IC package. A datum protrusion (5120) is provided on each of two adjacent side walls and configured to laterally invade the interior cavity. A chamfered surface (513) is formed along a joint between each of two adjacent side walls and the base section, and further adjacent each of the datum protrusions, thereby avoiding stress generation around the joint between each side wall and the base section.

16 Claims, 3 Drawing Sheets

ELECTRICAL CONNECTOR

BACKGROUND OF THE INVENTION

1. Field of the Invention

The present invention relates to the art of electrical connectors, and more particularly to an electrical connector for electrically connecting between an IC package with a substrate.

2. Description of the Related Art

One conventional electrical connector 5' is shown in FIG. 3 to include an insulative connector body 51' with a plurality of contacts 52' attached thereto. The connector body 51' includes a base section 511' with four side walls 512' surrounded thereby to form an interior cavity adapted to receive an IC package (not shown). Each of two adjacent side walls 512' is provided with a pair of datum protrusions 5120', which are utilized to precisely locate the contacts and the IC package relative to the side walls 512' of the connector body 51'. Typically, the IC package is loaded into the connector body 51' so as to establish electrical continuity between the IC package and a substrate (not shown). Frequent loading processes of the IC package onto the connector body 51' will result in stress concentration adjacent the datum protrusions 5120', particularly around a joint portion between the base section 511' and the respective side walls 512', thereby causing the joint portion cracked or somewhat fragile undesirable to the user of the electrical connector 5'. Therefore, there is a need to provide a new electrical connector to resolve the above-mentioned shortcoming.

SUMMARY OF THE INVENTION

An electrical connector according to one embodiment of the present invention includes a connector body holding a plurality of contacts. The connector body includes a base section with four side walls surrounded thereby to form an interior cavity adapted to receive an IC package. A datum protrusion is provided on each of two adjacent side walls and configured to laterally invade the interior cavity. A chamfered surface is formed along a joint between each of two adjacent side walls and the base section, and further adjacent each of the datum protrusions, thereby avoiding stress generation around the joint between each side wall and the base section.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
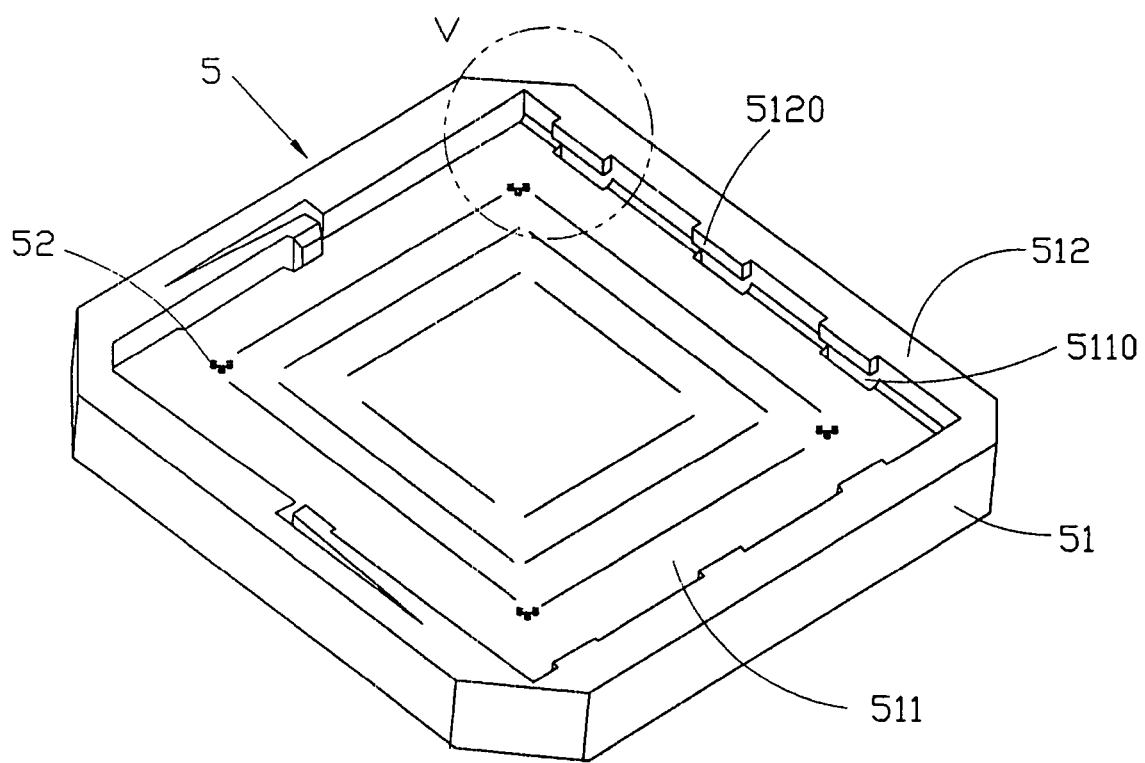
FIG. 1 is a perspective view of an electrical connector according to an embodiment of the present invention.
Figure 2:
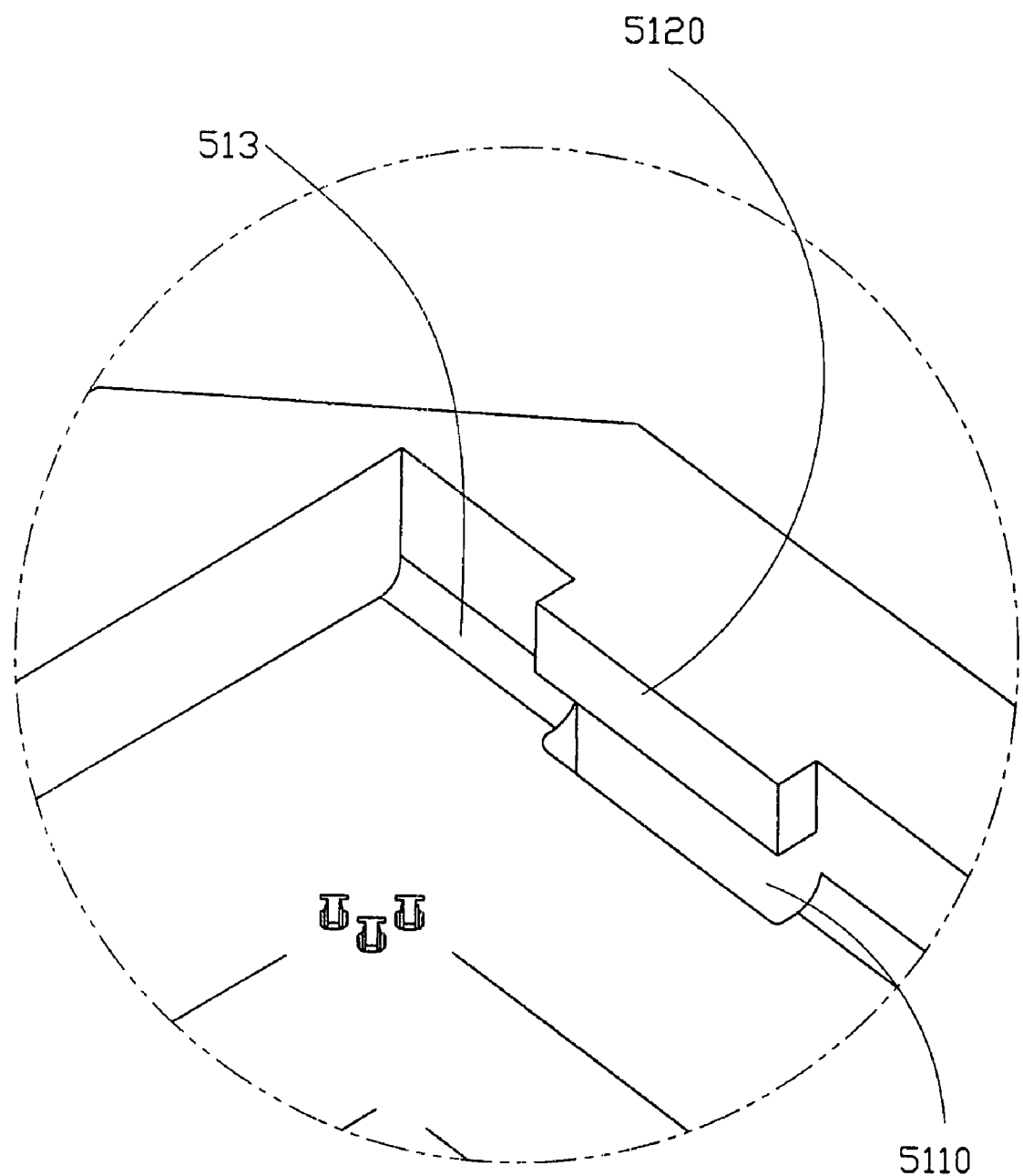
FIG. 2 is an enlarged view of a part "V" of the electrical connector of FIG. 1.
Figure 3:
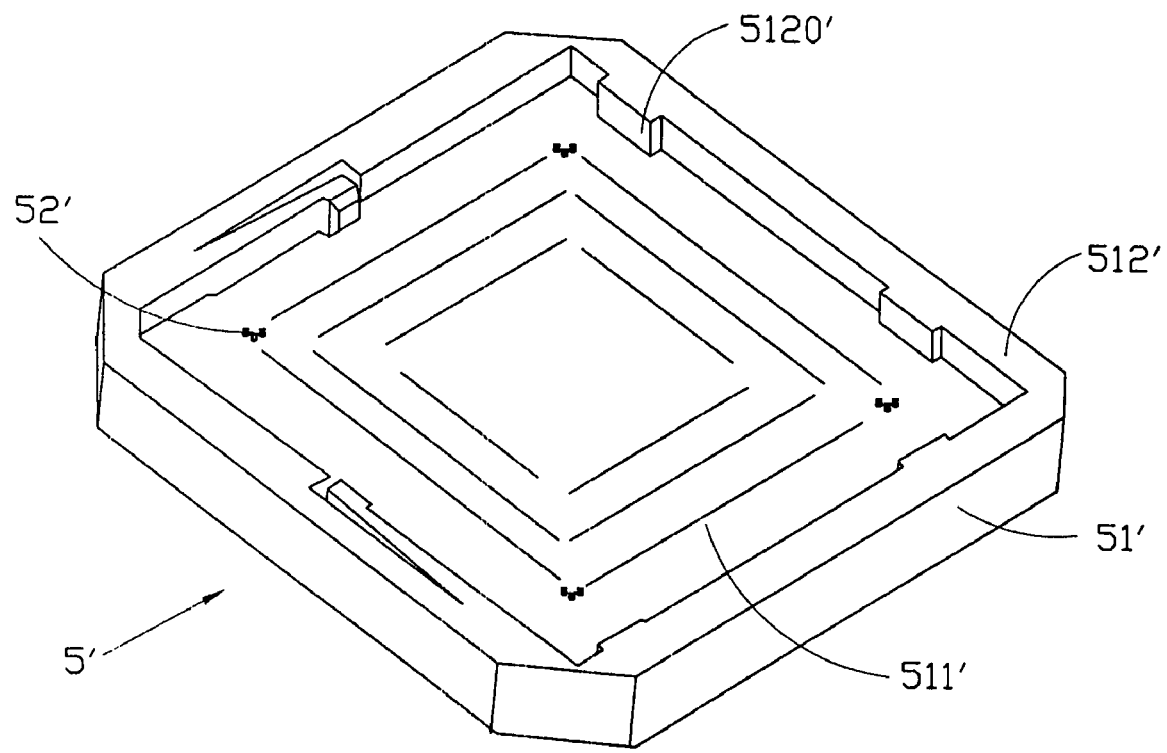
FIG. 3 is a perspective view of a conventional electrical connector.

Referring to FIGS. 1 and 2, an electrical connector 5 according to the embodiment is shown to include an insulative connector body 51 with a plurality of contacts 52 attached thereto. The electrical connector body 51 includes a base section 511 with four side walls 512 surrounded thereby to form an interior cavity adapted to receive an IC package (not shown). Each of two adjacent side walls 512 is provided with at least three datum protrusions 5120 evenly arranged along a length edge of each side wall 512, thereby forming additional force bearing points for the IC package after the IC package is loaded onto the connector body. Each datum protrusion 5120 has an outer face facing towards the interior cavity, with the outer faces of the datum protrusions 5120 disposed in a coplanar manner. The providence of additional datum protrusions 5120 can result in even force pushed against the IC package from the evenly-arranged datum protrusions 5120, thereby assuring the precise location of the IC package with respect to the peripheral side walls 512 of the connector body 51. Firstly, a chamfered/curved surface 513 is formed along a joint between each of two adjacent side walls 512 and the base section 511 and adjacent each datum protrusion 5120, and secondly the protrusion 5120 is spaced from a top face of the base section 511, thereby avoiding stress generation/concentration around the joint between each side wall 512 and the base section 511. In addition, an inspection window 5110 is formed on the base section 511 and proximate to each datum protrusion 5120, thereby enabling a measurement of the IC package in a first direction and a second direction substantially perpendicular to the first direction (as known in the prior art). In such a manner, registry of the IC package can be accurately controlled.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An electrical connector comprising:
    a connector body holding a plurality of contacts, the connector body including a base section with four side walls surrounded thereby to form an interior cavity adapted to receive an IC package;
    a datum protrusion provided on each of two adjacent side walls and configured to laterally invade said interior cavity; and
    a chamfered or curved surface extending upwardly from the base section to each said side wall along a joint between each said side wall and the base section and adjacent said datum protrusion.

2. The electrical connector of claim 1, wherein each of two adjacent side walls is provided wit at least three datum protrusions, each datum protrusion having an outer face facing towards the interior cavity, the outer faces of said at least three datum protrusions disposed in a coplanar manner.

3. The electrical connector of claim 1, wherein each of two adjacent side walls is provided with at least three datum protrusions, said at least three datum protrusions evenly arranged along a lengthwise edge of said side wall.

4. The electrical connector of claim 1, wherein an inspection window is formed on said base section and located proximate to each datum protrusion.

5. The electrical connector of claim 1, wherein each of said two adjacent side walls are equipped with at least three of said protrusions while having another two adjacent side walls, opposite to said respective side walls, each equipped with a spring contact arm, under a condition that there are said two protrusions respectively located adjacent a corresponding corner formed by the adjacent two sidewalls, and at least one said protrusion located between said two protrusions so as to cooperate with the opposite spring contact arm to provide a lateral balancing force to hold the IC package to be received.

6. The electrical connector of claim 5, wherein each of said two adjacent side walls are equipped with three protrusions while having another two adjacent side walls, opposite to said respective side walls, each equipped with a spring contact arm including a contact portion at a free end thereof, a median one of said three protrusions laterally aligned with said contact portion of the spring contact arm.

7. The electrical connector of claim 1, wherein the base section defines a through opening vertically aligned with each of said protrusions under a condition that the protrusions are spaced from a top face of the base section with a distance.

8. The electrical connector of claim 7, wherein said through opening is not smaller than a horizontal dimension of the corresponding protrusion.

9. An electrical connector comprising:
   a connector body holding a plurality of contacts, the connector body including a base section with a plurality of side walls to thereby commonly form an interior cavity adapted to receive an IC package; and
   a plurality of datum protrusions provided on each of two adjacent side walls and configured to laterally invade said interior cavity; wherein
   each of said two adjacent side walls are equipped with at least three of said protrusions while having another two adjacent side walls, opposite to said respective side walls, each equipped with a spring contact arm, under a condition that there are said two protrusions respectively located adjacent a corresponding corner formed by the adjacent two sidewalls, and at least one said protrusion located between said two protrusions so as to cooperate with the opposite spring contact arm to provide a lateral balancing force to hold the IC package to be received.

10. The electrical connector as claimed in claim 9, wherein a distance between every adjacent two protrusions is essentially similar to that between an outermost protrusion and a corresponding corner formed by the adjacent two sidewalls.

11. The electrical connector as claimed in claim 9, wherein each said spring contact arm include a contact portion at a free end thereof, each of said two adjacent side walls are equipped with three said protrusions with thereof a median protrusion laterally aligned with said contact portion of the spring contact arm.

12. The electrical connector as claimed in claim 9, wherein the base section defines a through opening vertically aligned with each of said protrusions under a condition that the protrusions are spaced from a top face of the base section with a distance.

13. The electrical connector as claimed in claim 12, wherein said through opening is not smaller than a horizontal dimension of the corresponding protrusion.

14. An electrical connector, comprising:
   a connector body holding a plurality of contacts, the connector body including a base section with a plurality of side walls to thereby commonly form an interior cavity adapted to receive an IC package;
   a plurality of datum protrusions provided on each of two adjacent side walls and configured to laterally invade said interior cavity; wherein
   the base section defines a through opening vertically aligned with each of said protrusions under a condition that the protrusions each has its bottom face spaced from a top face of the base section with a distance; wherein
   each of said two adjacent side walls are equipped with at least three of said protrusions while having another two adjacent side walls, opposite to said respective side walls, each equipped with a spring contact arm, under a condition that there are said two protrusions respectively located adjacent a corresponding corner formed by the adjacent two sidewalls, and at least one said protrusion located between said two protrusions so as to cooperate with the opposite spring contact arm to provide a lateral balancing force to hold the IC package to be received.

15. The electrical connector as claimed in claim 14, wherein each of said two adjacent side walls are equipped with three protrusions while having another two adjacent side walls, opposite to said respective side walls, each equipped with a spring contact arm including a contact portion at a free end thereof, a median one of said three protrusions laterally aligned wit said contact portion of the spring contact arm.

16. The electrical connector as claimed in claim 14, wherein each of said two adjacent side walls are equipped with three protrusions, a distance between every adjacent two protrusions is essentially similar to tat between an outermost protrusion and a corresponding corner formed by said adjacent two sidewalls.

* * * * *